United States Patent
Kim et al.

(10) Patent No.: US 10,136,557 B2
(45) Date of Patent: Nov. 20, 2018

(54) THERMAL MANAGEMENT SYSTEMS AND METHODS FOR HEAT GENERATING ELECTRONICS

(71) Applicant: GENERAL ELECTRIC COMPANY, Schenectady, NY (US)

(72) Inventors: Joo Han Kim, Niskayuna, NY (US); Hendrik Pieter Jacobus de Bock, Clifton Park, NY (US)

(73) Assignee: GENERAL ELECTRIC COMPANY, Shenectady, NY (US)

( * ) Notice: Subject to any disclaimer, the term of this patent is extended or adjusted under 35 U.S.C. 154(b) by 0 days.

(21) Appl. No.: 14/959,804

(22) Filed: Dec. 4, 2015

(65) Prior Publication Data
US 2017/0164517 A1    Jun. 8, 2017

(51) Int. Cl.
| | | |
|---|---|---|
| *H05K 7/20* | (2006.01) | |
| *F28D 15/02* | (2006.01) | |
| *F28D 15/04* | (2006.01) | |
| *G06F 1/20* | (2006.01) | |
| *F28F 21/02* | (2006.01) | |

(52) U.S. Cl.
CPC ..... *H05K 7/20672* (2013.01); *F28D 15/0233* (2013.01); *F28D 15/046* (2013.01); *G06F 1/20* (2013.01); *H05K 7/20336* (2013.01); *H05K 7/20681* (2013.01); *F28F 21/02* (2013.01); *G06F 2200/201* (2013.01)

(58) Field of Classification Search
CPC ............. H05K 7/2039; H05K 7/20336; H05K 7/20809; H05K 7/20672–7/20681; H05K 7/20818; F28D 15/04
See application file for complete search history.

(56) References Cited

U.S. PATENT DOCUMENTS

| | | | |
|---|---|---|---|
| 6,212,075 B1 | 4/2001 | Habing et al. | |
| 6,246,582 B1 | 6/2001 | Habing et al. | |
| 6,776,220 B1 * | 8/2004 | Low | B64G 1/506 165/104.33 |
| 6,793,009 B1 * | 9/2004 | Sarraf | F28D 15/02 165/104.26 |
| 6,804,117 B2 | 10/2004 | Phillips et al. | |

(Continued)

FOREIGN PATENT DOCUMENTS

EP    2 930 587 A1    10/2015

OTHER PUBLICATIONS

Campo et al., "Enhancing thermal performance in embedded computing for ruggedized military and avionics applications", Thermal and Thermomechanical Phenomena in Electronic Systems (ITherm), 2014 IEEE Intersociety Conference on, pp. 840-845, May 27-30, 2014, Orlando, FL.

(Continued)

*Primary Examiner* — Robert J Hoffberg
(74) *Attorney, Agent, or Firm* — GE Global Patent Operation; Pabitra Chakrabarti

(57) ABSTRACT

According to one embodiment, a thermal management system is provided that includes at least one chassis frame configured to minimize a thermal spreading resistance of the thermal management system. The chassis frame included at least one chassis body, at least one thermal skeleton embedded into the chassis body, and a working fluid contained within the thermal skeleton and used to dissipate heat from the chassis body.

21 Claims, 13 Drawing Sheets

(56) References Cited

U.S. PATENT DOCUMENTS

| | | | |
|---|---|---|---|
| 6,839,235 B2 | 1/2005 | St. Louis et al. | |
| 6,882,536 B2* | 4/2005 | Deeney | H01L 23/36 165/185 |
| 6,938,680 B2* | 9/2005 | Garner | F28D 15/04 165/104.26 |
| 7,177,154 B2* | 2/2007 | Lee | G06F 1/181 165/104.33 |
| 7,246,655 B2* | 7/2007 | Mochizuki | F28D 15/046 165/104.21 |
| 7,250,674 B2* | 7/2007 | Inoue | H01L 23/4006 165/80.4 |
| 7,345,877 B2* | 3/2008 | Asfia | H05K 7/20672 165/104.33 |
| 7,460,367 B2 | 12/2008 | Tracewell et al. | |
| 7,836,597 B2* | 11/2010 | Datta | F04B 17/00 165/104.33 |
| 7,866,372 B2* | 1/2011 | Slaughter | B22F 3/1055 165/80.2 |
| 7,907,409 B2* | 3/2011 | Wyatt | H05K 7/20809 165/104.26 |
| 7,965,508 B2* | 6/2011 | Yamamoto | H01L 23/473 174/15.1 |
| 8,018,717 B2* | 9/2011 | Corbeil | A61B 6/037 165/104.33 |
| 8,223,494 B2 | 7/2012 | Bult | |
| 8,421,235 B2* | 4/2013 | Ide | H01L 23/473 257/675 |
| 8,820,684 B2* | 9/2014 | McKinnon | B64G 1/50 244/171.8 |
| 8,842,437 B2* | 9/2014 | Chang | G06F 1/181 165/185 |
| 8,921,702 B1* | 12/2014 | Carter | H05K 1/0204 165/104.11 |
| 9,333,599 B2* | 5/2016 | de Bock | B23P 15/26 |
| 9,468,131 B2* | 10/2016 | Brandt | H05K 7/20218 |
| 9,534,855 B2* | 1/2017 | Chauhan | F28F 21/02 |
| 9,546,826 B1* | 1/2017 | Carter | F28D 15/046 |
| 2003/0051859 A1* | 3/2003 | Chesser | F28D 15/043 165/46 |
| 2003/0189815 A1* | 10/2003 | Lee | H01L 23/427 361/719 |
| 2011/0267776 A1* | 11/2011 | Porreca | H05K 7/20545 361/694 |
| 2013/0098417 A1* | 4/2013 | Gavillet | H01L 23/4275 136/200 |
| 2014/0251577 A1 | 9/2014 | Connors | |
| 2015/0001093 A1* | 1/2015 | Carter | B23H 9/14 205/640 |
| 2015/0060021 A1* | 3/2015 | Chauhan | F28D 15/046 165/104.26 |
| 2015/0181763 A1* | 6/2015 | de Bock | B23P 15/26 361/689 |
| 2015/0289413 A1* | 10/2015 | Rush | H05K 7/20672 361/700 |
| 2015/0305198 A1 | 10/2015 | Brandt et al. | |
| 2016/0069622 A1* | 3/2016 | Alexiou | G06F 1/1656 165/146 |
| 2017/0064868 A1* | 3/2017 | Rush | H05K 7/20336 |
| 2017/0067693 A1* | 3/2017 | Rush | F28F 7/02 |
| 2017/0235349 A1* | 8/2017 | Ghioni | F28D 15/02 361/679.47 |

OTHER PUBLICATIONS

Scott et al., "Evaluation of Heat Pipes for Conduction-Cooled Level II Avionic Packages", Heat Transfer Engineering, vol. 9, Issue 3; pp. 32-43, 1988.

Yang et al., "Recent developments of lightweight, high performance heat pipes", Applied Thermal Engineering, Sciencedirect, vols. 33-34, pp. 1-14, Feb. 2012.

Extended European Search Report and Opinion issued in connection with corresponding EP Application No. 16200239.8 dated Apr. 20, 2017.

Office Action issued in connection with corresponding CA Application No. 2949688 dated Sep. 25, 2017.

* cited by examiner

THERMAL MANAGEMENT SYSTEMS AND METHODS FOR HEAT GENERATING ELECTRONICS

BACKGROUND

The operation of electronic devices requires satisfactory thermal management to ensure proper function. As the electronic devices become heated, the devices suffer from computing performance degradation, functional failure, and lower lifespan.

For example, the capability of avionics is determined by the computing processing ability of the system. Typically there are size and weight constraints for an avionics system. These systems are thermally limited such that, for a given volume, only a certain number of cores or processors can operate before thermal issues such as overheating occurs. Typically, processors are significantly de-rated (up to 80%) to avoid overheating in high ambient temperature environments—drastically reducing capability. If the heat can be removed from the system more effectively, more processing power, and ultimately more processing capability, is possible from the same volume and weight.

There are a number of conventional cooling methods such as fans and heat sinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

Some improved advances include heat pipes and synthetic jet cooling. Heat pipes provide for some efficiency improvements in the thermal characteristics whereas synthetic jets essentially provide for improved reliability relative to fans.

System designers have increasingly recognized that the thermal management is a critical factor to the successful deployment of electronics and currently design assemblies and systems in order to optimize thermal performance.

The thermal conduction path from the circuit card to the cold reservoir is limited by current spreading technology. Certain conventional designs include the use of milled/machined aluminum heat frames, composite materials for chassis and mountings closer to the cold reservoir. Further aspects include integrating planar and linear heat pipe structures.

What is needed to further enhance processing power and functionality is to improve the thermal performance.

SUMMARY

In accordance with one aspect of the invention, a thermal management system, comprises at least one chassis frame configured to minimize a thermal spreading resistance of the thermal management system, the chassis frame comprising: at least one chassis body configured to optimize its weight by replacing at least part of its metallic structure by lighter substitute material; wherein the lighter substitute material comprises at least one thermal skeleton embedded into the chassis body and configured to provide a thermal conduction path for heat dissipating from the chassis body; and a working fluid contained within the thermal skeleton and used to further dissipate the heat from the chassis body; and a heat sink thermally coupled to the system and configured to further dissipate the heat from the working fluid.

In accordance with another aspect of the invention, a thermal management system comprises at least one chassis frame configured to minimize a thermal spreading resistance of the thermal management system, the chassis frame comprising: at least one chassis body; at least one thermal skeleton embedded into the chassis body; and a working fluid contained within the thermal skeleton and used to dissipate heat from the chassis body.

In accordance with another aspect of the invention, a method comprises minimizing a thermal spreading resistance in a chassis frame comprising: providing a chassis body; optimizing a weight of the chassis body by removing at least part of its metallic structure; embedding at least one thermal skeleton into the chassis body and thereby providing a conduction path for dissipation of heat from the chassis body; transporting a working fluid within the thermal skeleton for further dissipation of heat from the chassis body; and reducing at least one of: thermal gradient, thermal non-uniformity and a plurality of hot-spots within the chassis body.

These and other aspects, features, and advantages of this disclosure will become apparent from the following detailed description of the various aspects of the disclosure taken in conjunction with the accompanying drawings.

DRAWINGS

Embodiments described herein will become better understood when the following detailed description is read with reference to the accompanying drawings in which like characters represent like parts throughout the drawings, wherein.

DETAILED DESCRIPTION

Figure 1:
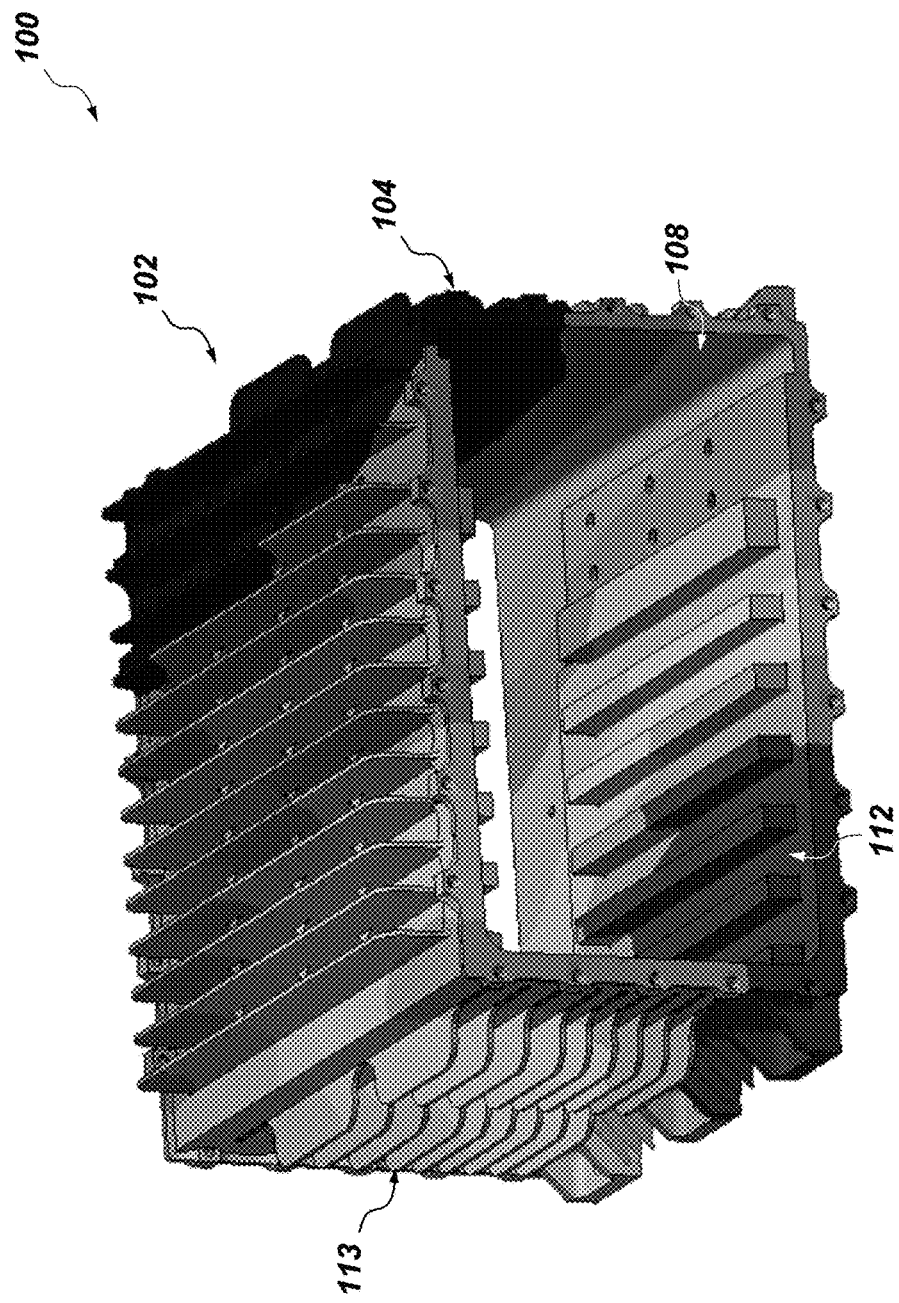
FIG. 1 shows a conventional chassis frame assembly.

Example embodiments are described below in detail with reference to the accompanying drawings, where the same reference numerals denote the same parts throughout the drawings. Some of these embodiments may address the above and other needs.

The thermal management system in one example describes a thermal management device comprising a thermal skeleton that contains a working fluid. On one example a specially engineered internal wick structure within the thermal skeleton interacts with the working fluid to enhance two phase heat transfer and working fluid transport. One part of the internal structure includes fine structures engineered to provide strong capillary forces to the working fluid at locations where they are required. Other parts of the internal structure include fine structures engineered to transport the working fluid with minimal pressure drop while preventing interference with the vapor state of the working fluid. Additional support structures, as part of the internal structure act to internally support and strengthen the thermal skeleton, and thereby to provide additional paths for fluid transport. Working circuit cards, usually, that generate parasitic heat losses are thermally connected to the thermal management system. In effect, the thermal management system establishes a specially engineered thermal conduction path between the circuit cards and a cold reservoir and a heat sink and thereby transfers the heat between the circuit cards to the cold reservoir and heat sinks.

FIG. 1 depicts a conventional thermal management system 100. Referring to FIG. 1, a conventional chassis frame 102 is made of a chassis body 104. Chassis body 104 houses and hold together a number of circuit cards 108 of varying size and shape and is secured within the chassis body 104. Circuit cards are disposed on the circuit cards 108 and can include components such as processors and other such components that generate considerable heat. The chassis body 104 is shown having a number of interior chassis grooves 112 for seating a number of circuit cards 108. The chassis body 104 has a network of exterior chassis fins 113 about the perimeter of the chassis body 104 to provide for heat transfer. The chassis fins 113 are typically on three sides, such as right, left, and top. When there are multiple electronics in the chassis body, there may be considerable heat generated by the individual components such that other heat transfer features such as heat pipes may be utilized. In this example, the circuit cards 108 are inserted into the chassis body 104 via the grooves 112 using several attachment means (not shown) to secure the circuit cards 108 to the chassis body 104.

In such a conventional system, the circuit cards typically transfer the heat from the components on circuit cards 108 to the chassis body 104, particularly since the components may have different shape/size and the chassis frame 102 is configured to allow for the highest component height. More efficient heat transfer occurs when the components are closer to the chassis body 104. Thus in the conventional system the heat transfer for lower components that generate heat is not optimal. In addition, certain components on the circuit cards 108 generate more heat and can result in hot spots or locations where there is greater heat that needs to be dissipated. The chassis body 104 is typically constructed of a material such as aluminum or such other metal to provide for efficient heat transfer of has a sufficient size to facilitate the heat transfer.

While this form of heat dissipation works to some degree, it can only dissipate a certain amount of heat generated by the components of the circuit cards 108 and requires a large heat dissipation mechanism. As the processing capabilities have increased, the individual components and overall chassis have decreased in size and require even greater heat dissipation capabilities in a smaller space.

Figure 2:
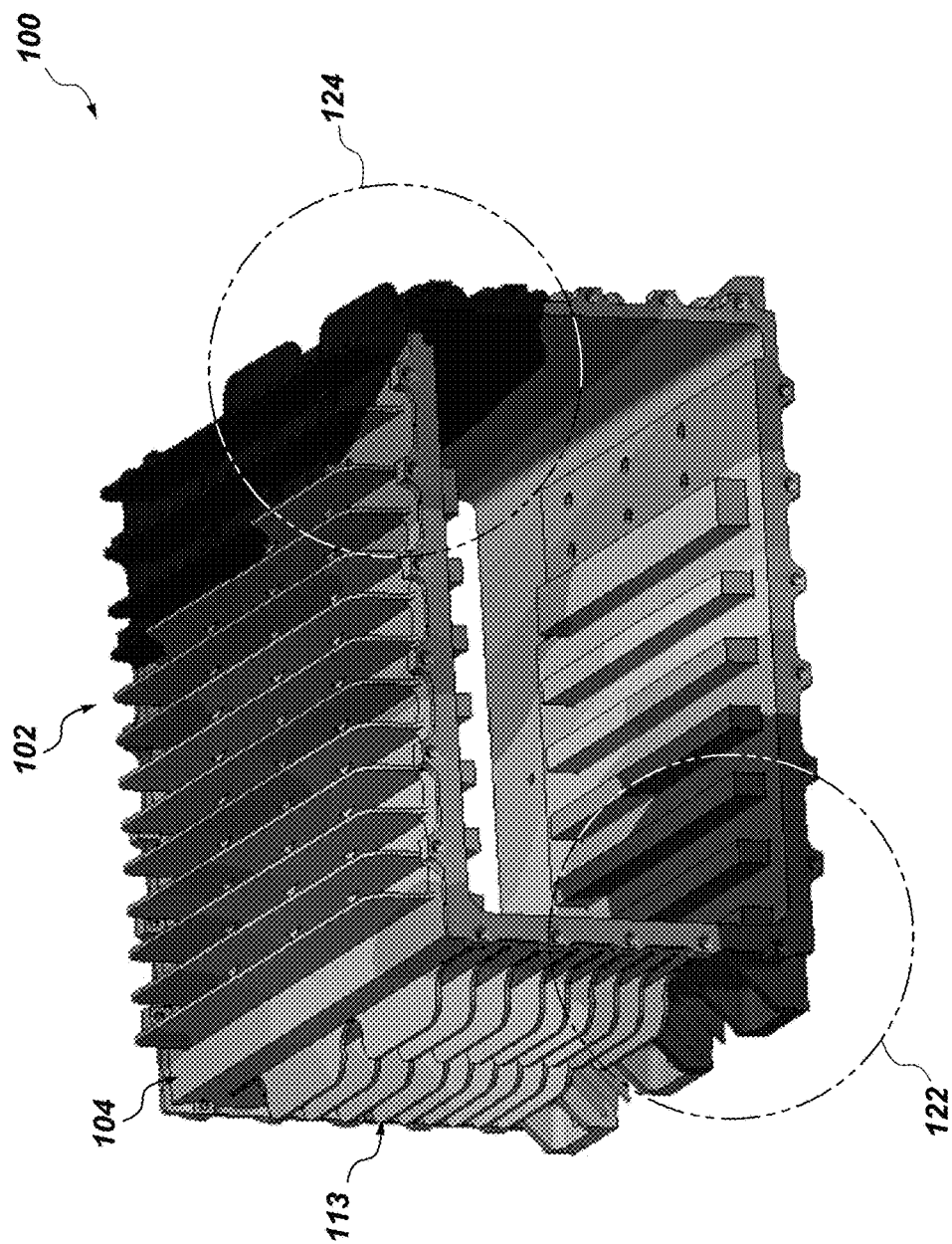
FIG. 2 shows the thermal flow in a conventional chassis with attached assembly.

FIG. 2 shows the thermal flow path in a conventional chassis frame 102 of FIG. 1 without the assembly of circuit cards 108. Specifically, FIG. 2 is a cut away side perspective and depicts a conventional chassis frame 102. As noted in FIG. 1, components from the circuit cards 108 generate heat that is conducted to the chassis body 104. The chassis body 104 further spreads the heat to the chassis frame 102 and then to the fins 113. Thus, the heat is finally dissipated to the environment and fins 113 are designed to be large enough to dissipate the overall expected heat. FIG. 2 shows a hot spot or hotter region 122 and a colder region 124. The hot spot 122 is where local heat concentration occurs due to inadequate heat dissipation through the system typically owing to thermal spreading resistance of the system. Typically, such thermal spreading resistance is caused by several thermal concentration events such as thermal gradient, thermal non-uniformity and hot-spot formation within the chassis body 104. In this example, the hot spot components may be subject to degradation or failure. Alternatively, the system may be over engineered by being larger or having increased thermal cooling features resulting in a larger form factor and/or less efficient system.

Figure 3:
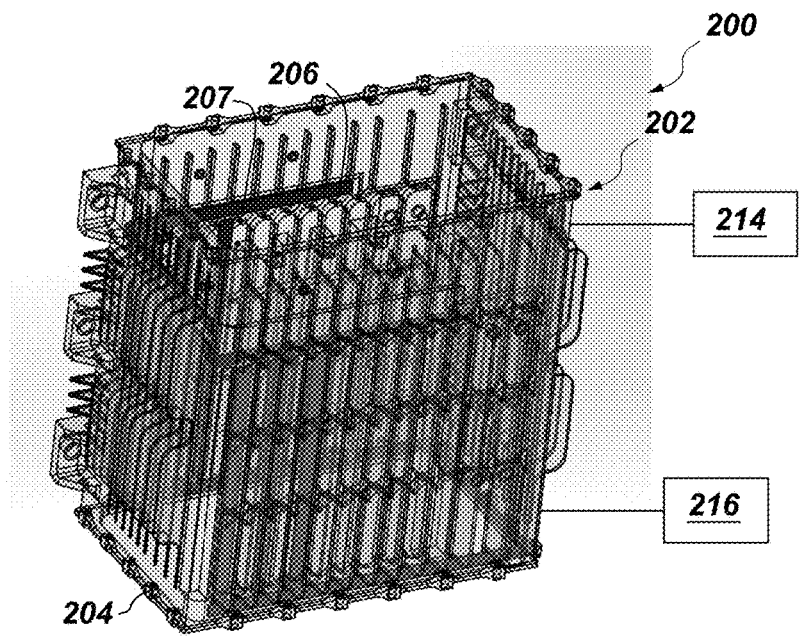
FIG. 3 illustrates one embodiment of the present system that includes an integrated thermal skeleton.

FIG. 3 illustrates one embodiment of the present system that includes an integrated thermal management system 200 for enhanced heat dissipation. The thermal management system 200 includes a chassis frame 202 configured to minimize a thermal spreading resistance of the thermal management system. The chassis frame 202 includes a chassis body 204 and a thermal skeleton 206 embedded into the chassis body 204. The thermal skeleton 206 provides a thermal conduction path for the heat and can include thermal components such as heat pipes, copper rods, diamond rods and graphite rods. In one embodiment of the invention, a single hermetic 3-dimensional heat pipe structure serves as the thermal skeleton 206. In another embodiment of the invention, a 3-dimensional heat pipe structure constructed from adjoining heat pipes serves as the thermal skeleton 206.

In this example, a working fluid 207 is contained within the thermal skeleton 206 and is used to dissipate heat from the chassis body 204. The management system 200 further includes a cold reservoir 214 and a heat sink 216 thermally coupled to the chassis frame 202 and configured to further dissipate the heat from the working fluid 207.

The integrated thermal management system 200 may be manufactured by additive manufacturing. Specifically, the chassis body 204 is formed by additive manufacturing. As used herein, additive manufacturing refers to processing techniques such as 3D printing, rapid prototyping (RP), direct digital manufacturing (DDM), selective laser melting (SLM), electron beam melting (EBM), and direct metal laser melting (DMLM).

The chassis frame 202 houses a plurality of circuit cards 208 (FIG. 4) comprising heat generating components that vary in size and shape. Further, the chassis body 204 is in close proximity to the heat generating components 208. Further, the chassis body 204 is configured to optimize its weight by replacing at least part of its metallic structure by a lighter substitute material. And in one embodiment, the lighter substitute material is the thermal skeleton 206 itself.

In addition, the chassis frame 202 in one example is designed to be in close proximity for conductive coupling with not only the upper surface or top of the circuit cards 208 but in some examples on one or more sides of the circuit card 208. The ability to effectuate heat transfer over a greater surface area of the circuit cards 208 greatly enhances the thermal management capabilities of the chassis body 204. In one example the chassis body 204 is conductively coupled to the top surface and at least one side surface of the circuit cards 208. As used herein, conductively coupled refers to being in direct, indirect or close proximity to a component such that heat transfer can occur. For the indirect contact, a material such as a thermal interface material (not shown) can be utilized. The chassis body 204 is shown having a number of interior chassis grooves 212 for seating a number of circuit cards 208.

Figure 4:
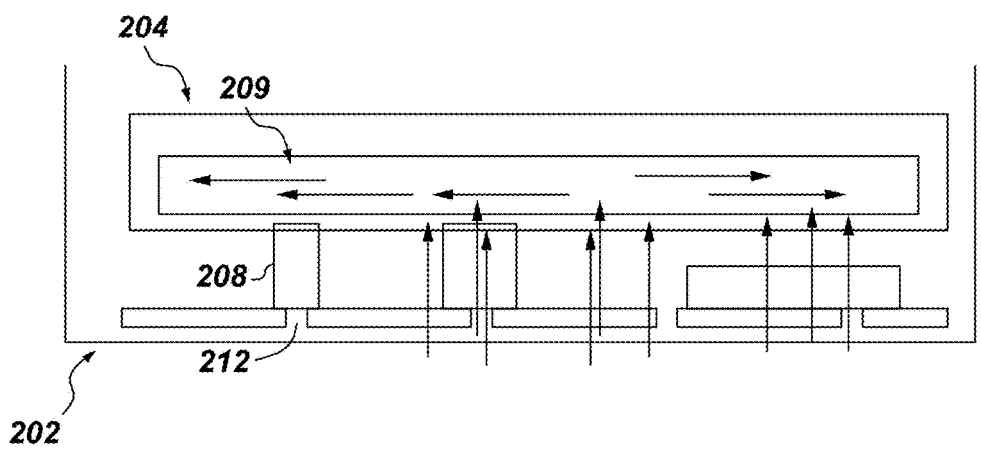
FIG. 4 depicts thermal flow path through the thermal skeleton according to one embodiment.

FIG. 4 depicts thermal flow path through the thermal skeleton according to one embodiment. Referring to FIG. 4, a chassis frame 202 is depicted in a cut away side perspective view. The thermal skeleton 206 is embedded in the chassis body 204 and is custom designed to conform to the heat generating circuit cards 208 and optimize heat transfer by being in close proximity to the components. In one example the thermal skeleton 206 is configured to conduct heat in exemplary thermal flow path 209 from at least one surface of the circuit cards 208, in particular those that generate the most heat. In another example, the thermal skeleton 206 is configured to conduct heat in exemplary thermal flow path 209 from more than one surface of the circuit cards 208 such as the top surface and one or more side surfaces.

In one embodiment, the thermal skeleton 206 comprises a porous wick structure (explained in more details below) on the interior walls and the porous wick structure is configured to transport the working fluid by capillary action from a heated portion to the cold reservoir 214 and a heat sink 216 located near at least one of the sides. The liquid is converted to vapor by the heated circuit cards 208, wherein the vapor absorbs the heat and moves outwards towards the cold reservoir 214 where the vapor is condensed back into liquid. Thus, the cold reservoir 214 and a heat sink 216 provide for further heat transfer such that heat from the vapor is removed and turns into liquid.

Figure 5:
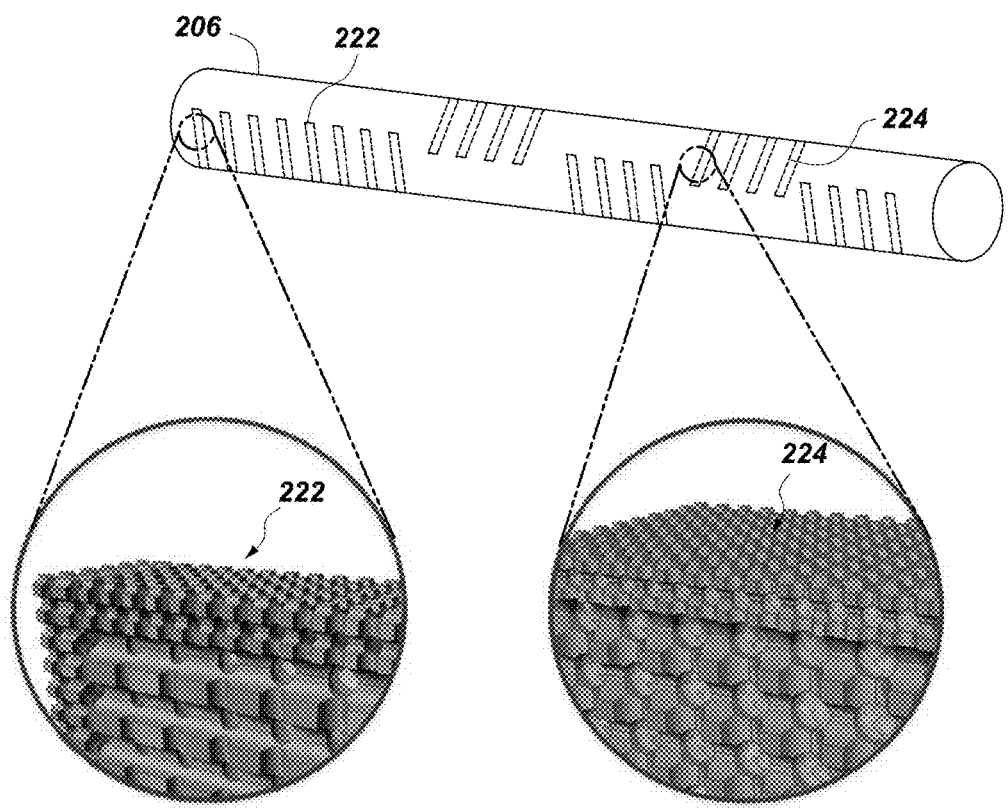
FIG. 5 is another example of the thermal skeleton and various non-uniform wick structures.

FIG. 5 is an example of a thermal skeleton 206 with various non-uniform wick structures. In FIG. 5 the thermal skeleton assembly in this embodiment illustrates a thin thermal skeleton 206 with the wick structures 222 and/or 224 formed on the interior wall of the thermal skeleton 206. In one example the wick is a non-uniform wick through the thickness direction 222. In a further example the wick is a non-uniform wick in the thickness and planar directions 224. As used herein, the "thickness" refers to dimensions normal to the skin or outermost surface of the thermal skeleton and "planar" refers to dimensions parallel or coplanar with the skin or outermost surface of the thermal skeleton.

Figure 6:
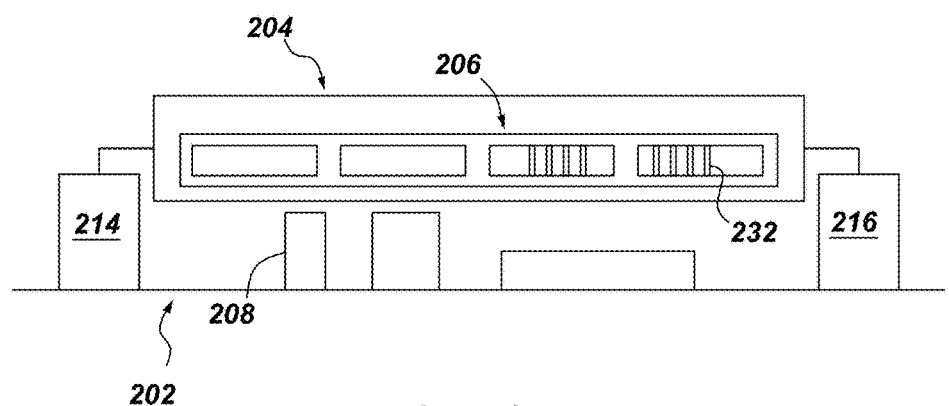
FIG. 6 shows a thermal skeleton embodiment with wick structures for enhanced support and fluid flow.

FIG. 6 shows another example of the thermal skeleton 206 having internal supports. FIG. 6 shows the thermal skeleton 206 embodiment with off-plane wick structures for enhanced support and fluid flow. Referring to FIG. 6, the thermal skeleton 206 is depicted showing exemplary internal supports or posts 232 that can be used to enhance stiffness and increase the liquid return. In this example, the thermal skeleton 206 includes one or more posts 232 that add greater stiffness to the assembly. A further aspect of the supports 232 is to increase the liquid transport by means or capillary action. In one embodiment of the invention the posts 232 are solid and in another embodiment of the invention, the posts 232 are hollow. The circuit cards 208 that generate heat that is conveyed to the thermal skeleton 206 due to the close proximity to at least one side of the thermal skeleton 206. The heat from the circuit card 208 converts the liquid in the thermal skeleton 206 to vapor that is then conveyed to the cold reservoir 214 and the heat sink 216 and converted to liquid. The liquid is transported by the wick structure 232 that is formed on the thermal skeleton 206. The posts 232 in this example are integrally formed wick structures that provide further capability to transport the liquid.

Figure 7:
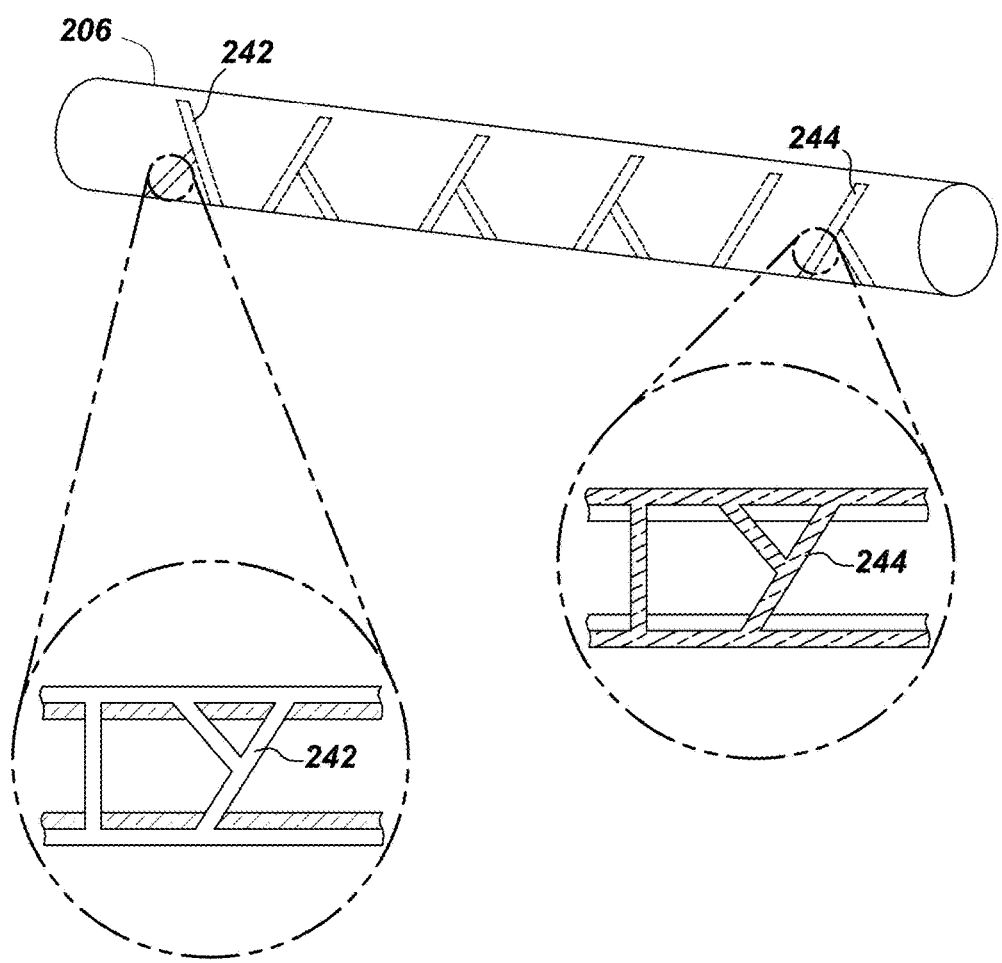
FIG. 7 depicts various embodiments of the structural characteristics for the internal supports for the 3D thermal skeleton.

FIG. 7 shows another embodiment of the thermal skeleton 206 with internal support structures 242, 244 that may also serve as feeder arteries for the working liquid. The circuit cards 208 generate heat that is transferred to the thermal skeleton 206 which causes evaporation of the liquid in the wick structures 242, 244 and converts the liquid to vapor that travels above the wick structures 242, 244 to the receptacles. The internal support structures 242, 244 in one example resemble bridge trusses or other bio-inspired structures for the thermal skeleton case for high strength and low weight. Typically, the thickness of the thermal skeleton case is 100-150 microns. However, using support structures such as 242, 244, the thermal skeleton case and the wick features can be made thinner, especially in proximity of the hot circuit cards and enhanced fins to decrease the thermal resistance. The wick structure and the support structures in one example are integrally formed by 3D printing or other additive manufacturing processes.

FIG. 7 depicts various embodiments and structural characteristics for the internal supports for the 3D thermal skeletons described herein. The internal supports are used, for example, to maintain the shape of the thermal skeleton and the dimensions for the vapor and liquid transport. The thermal skeleton 206, in a further embodiment includes internal supports that are fabricated via the 3D printing process in numerous designs, number, shapes and sizes such as shown in FIG. 7. In one example, the internal supports 242 include liquid feeder arteries to facilitate the liquid transport. Another example includes having solid internal support structures that are curved or have a curved portion. In other embodiments, the supports 244 comprise one or more solid internal support structures with braces that can be perpendicular within the thermal skeleton case or angled. For example, the internal supports can be porous structures that can be straight or curved. Operationally, the supports should be designed such that the thermal skeletons can withstand atmospheric pressure at any point of time. Specifically, the thermal skeletons should neither break down under high atmospheric pressure nor implode under low atmospheric pressure. Further, the supports should be designed such that the thermal skeletons do not affect the overall desired stiffness or rigidity of the chassis assembly.

The number of the internal supports may be dependent upon the design criteria and factors include the required support for the thermal skeleton case and the thermal properties of the various supports. The size and shape for the internal supports also depends upon the design criteria and thermal/mechanical requirements. Whenever the supports are desired only for lending structural strength to the thermal skeleton, solid supports are used. On the other hand, when the supports are desired additionally for enhanced cooling of the circuit cards, wick structure is used.

According to one embodiment, there are various wick structures that are employed with the thermal skeleton assemblies. In one example the wick structures are formed from additive manufacturing processes such as 3D printing. The wick structures can be uniform or non-uniform wick structures in multiple directions. According to one embodiment, the wick structures are deployed within the internal space of the thermal skeleton and also serve as internal support structures.

Figure 8:
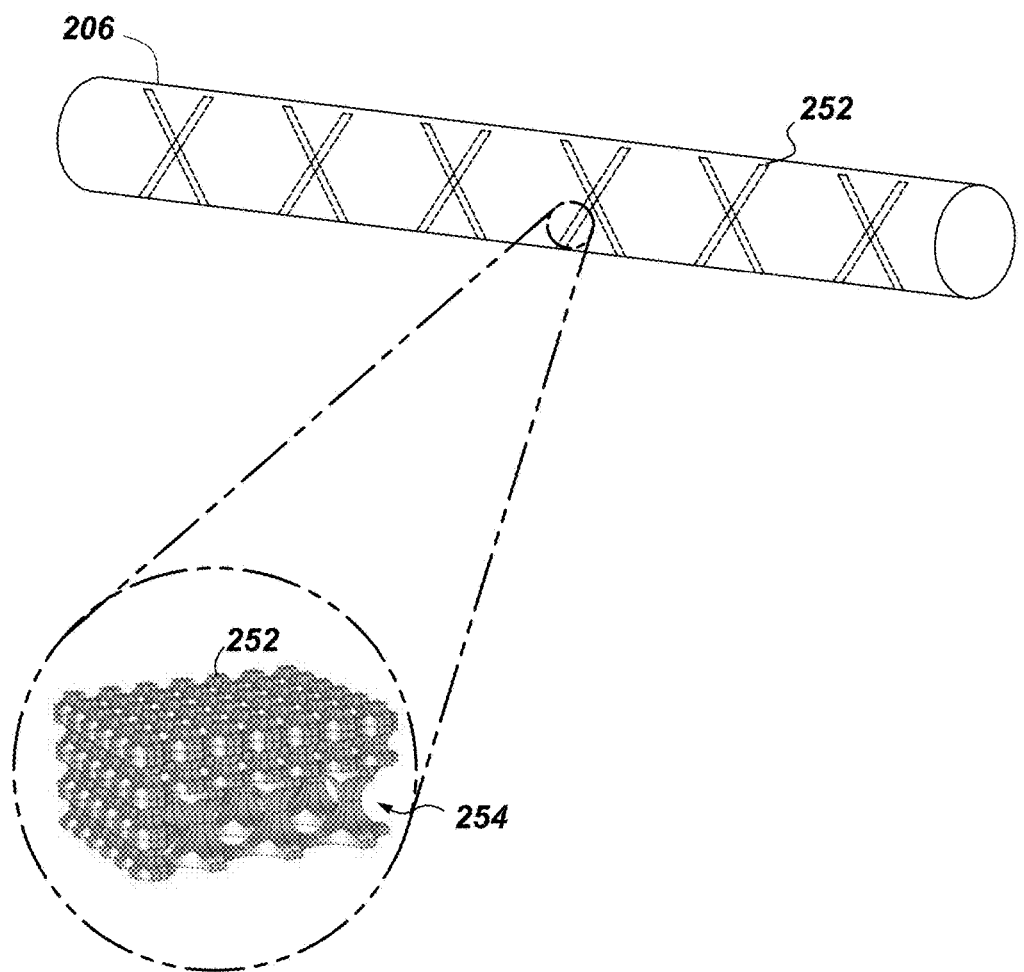
FIG. 8 depicts several examples of the non-uniform wick structure.

FIG. 8 further depicts several examples of the non-uniform wick structure. Specifically, FIG. 8 shows a perspective view of a non-uniform wick structure 252 in the thickness direction (z direction). In FIG. 8, the non-uniform wick structure 252 in the thickness direction shows the pores 254 which in this example has larger size pores proximate the thermal skeleton for transporting liquid. The pores on the vapor side are of a smaller pore size and transport the vapor to receptacles in the thermal skeleton. The pores in these examples are round or curved spaces, wherein the curved wick structure allows for 3D printing in any orientation that allows for non-planar thermal skeletons.

The structures shown in FIG. 8 are one example of a class of geometries by additive manufacturing in almost any orientation and straightforward transitions from larger to smaller pores and vice-versa. The one example shown is for circular cylindrical "bore-holes" along the three axes. It is to be noted that, apart from the cut planes, there are no straight surfaces in this pore-scale geometry. This attribute is used for build-orientation of independent non-uniform wick structures. The figures show non-uniform wick structures built on a planar surface, but a further embodiment provides for deforming these wick structures to follow a curved 3D surface that in one example has a large radius of curvature relative to the thickness of the wick structure layer. These representative wick structures 252 that are 3D printed can be built in numerous orientations, unlike posts or braces, because it is built with curves or arc portions. For example, large overhangs cannot be effectively printed without support structures, and these wick structures allow for internal build supports that can be integrated with the inner surfaces, namely the vapor side and the casing side of the thermal skeleton.

Figure 9:
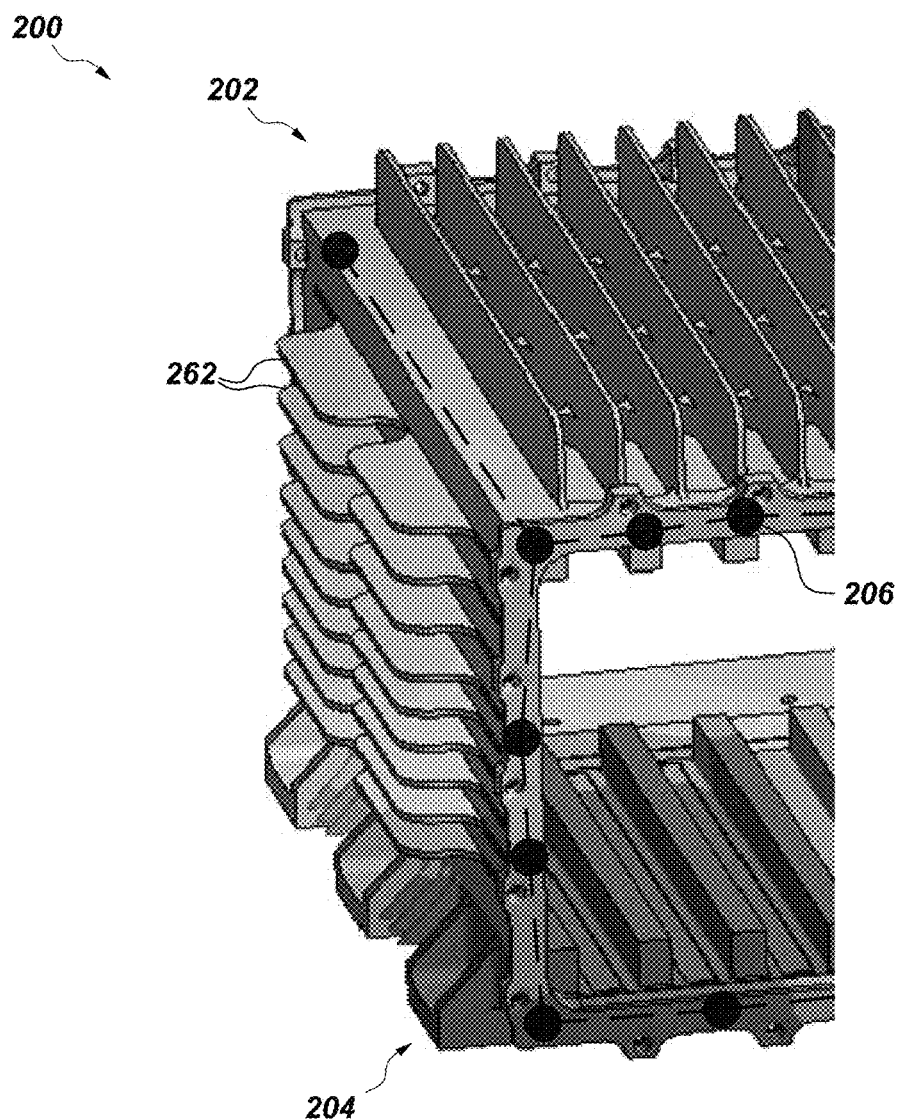
FIG. 9 shows thermal skeleton embodiments with integrated hollow fins.

FIG. 9 show thermal skeleton embodiments with integrated hollow fins. As shown in FIG. 9, the thermal skeleton 206 is shown according to yet another example. In this example, the thermal skeleton fins 262 are hollow thermal skeleton fins, thereby permitting a greater surface area for heat transport. The large condenser surface area associated with the fins 262 dramatically decreases the contribution of the condensation thermal resistance (temperature drop) in the thermal resistance chain. In another embodiment, the hollow fins may be replaced by other heat exchange mechanisms such as an integral fluid heat exchanger or a cold plate interface coupled to the system.

Figure 10:
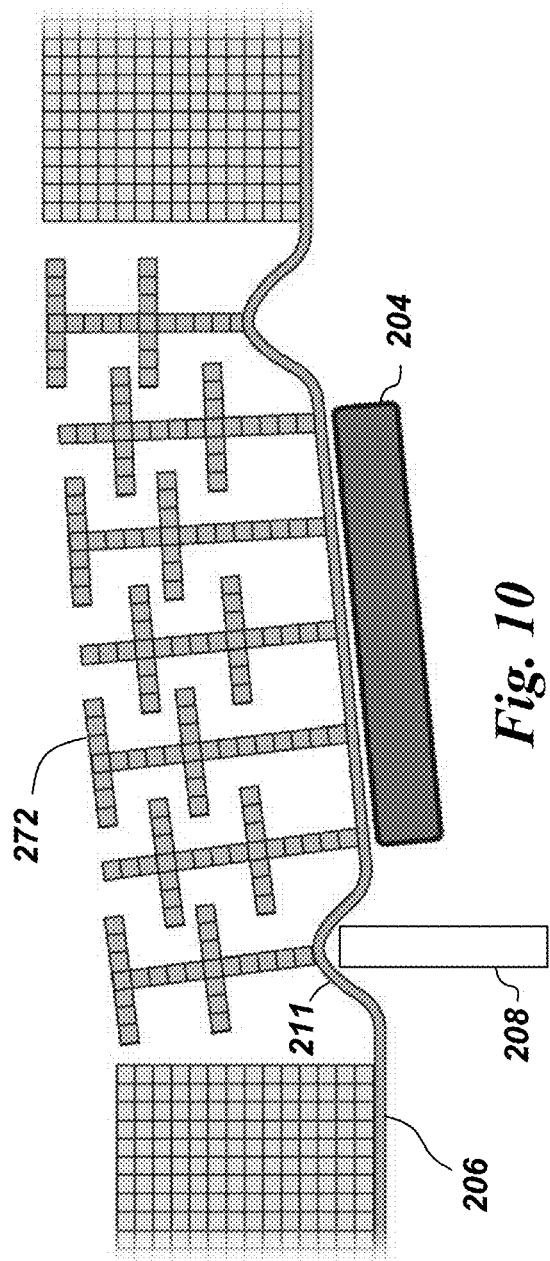
FIG. 10 is another example of the thermal skeleton with complaint wall and wick structures.

FIG. 10 is another example of the thermal skeleton 206 with compliant wall and wick structures. Referring to FIG. 10, the thermal skeleton 206 includes interior wall 211 (thermal skeleton case) and wick structures 272. As for the wall 211, it conforms to the top of the circuit cards 208 represented by an angled rectangle. The rectangle is sometimes angled/slanted because the circuit cards are "tipped" relative to PCB due to manufacturing tolerances and thus may have a non-horizontal top-profile. Operationally, the thermal skeleton case 211 needs to adapt to the angled top-profile and at least that area of the thermal skeleton case wall is made compliant. Exaggerated representations of ridges in the thermal skeleton case enable the desired compliance without deformation. In other examples, in addition to the wall 211, the wick structures 272 associated with the compliant part of the wall 211 are also made compliant. Referring again to FIG. 10 once more, 272 refers to the plurality of wick structures that are compliant. There are various ways these complaint parts of the thermal skeleton case 211 and the wick structures 272 can be permuted and combined as described below.

Figure 11:
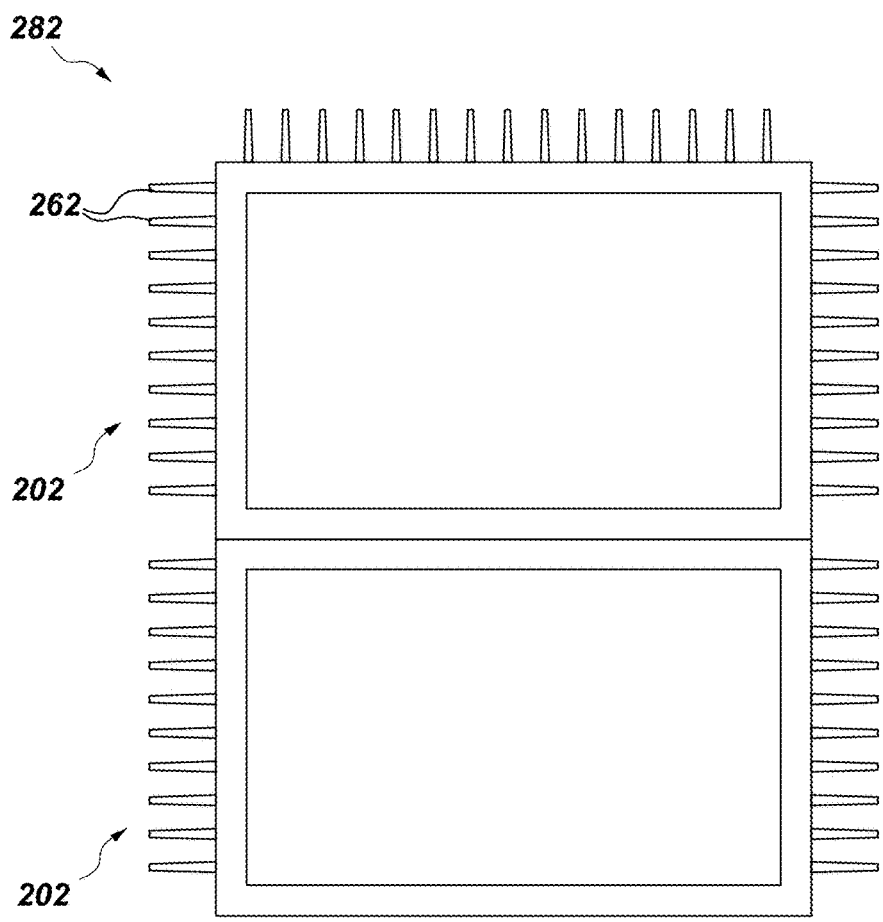
FIG. 11 shows thermal management system as a vertical assembly including several thermal skeletons assemblies vertically assembled to form the chassis body.

FIG. 11 shows a thermal management system 282 as a vertical assembly, including several chassis frames 202, assembled along with chassis case portions such as an upper and lower chassis mount to form the chassis 282. Referring again to FIG. 11, the modular stacked assembly 282 includes multiple chassis frames 202, each configured to be stacked together to form the larger unit. In one example the assemblies 202 are coupled to respective thermal skeleton assemblies which are then combined into respective chassis body 204. As previously described the can be coupled to the thermal skeleton assemblies such as by friction fit or other securing mechanisms. The chassis frames 202 including corresponding chassis body 204 and thermal skeleton 206 are secured to each other by fastening mechanisms such as bolts. There can be any number of thermal skeleton assemblies stacked together and secured as a unitary assembly. The outermost portions of the modular stacked assembly may or may not be coupled and may be used for packaging and securing the assemblies.

Figure 12:
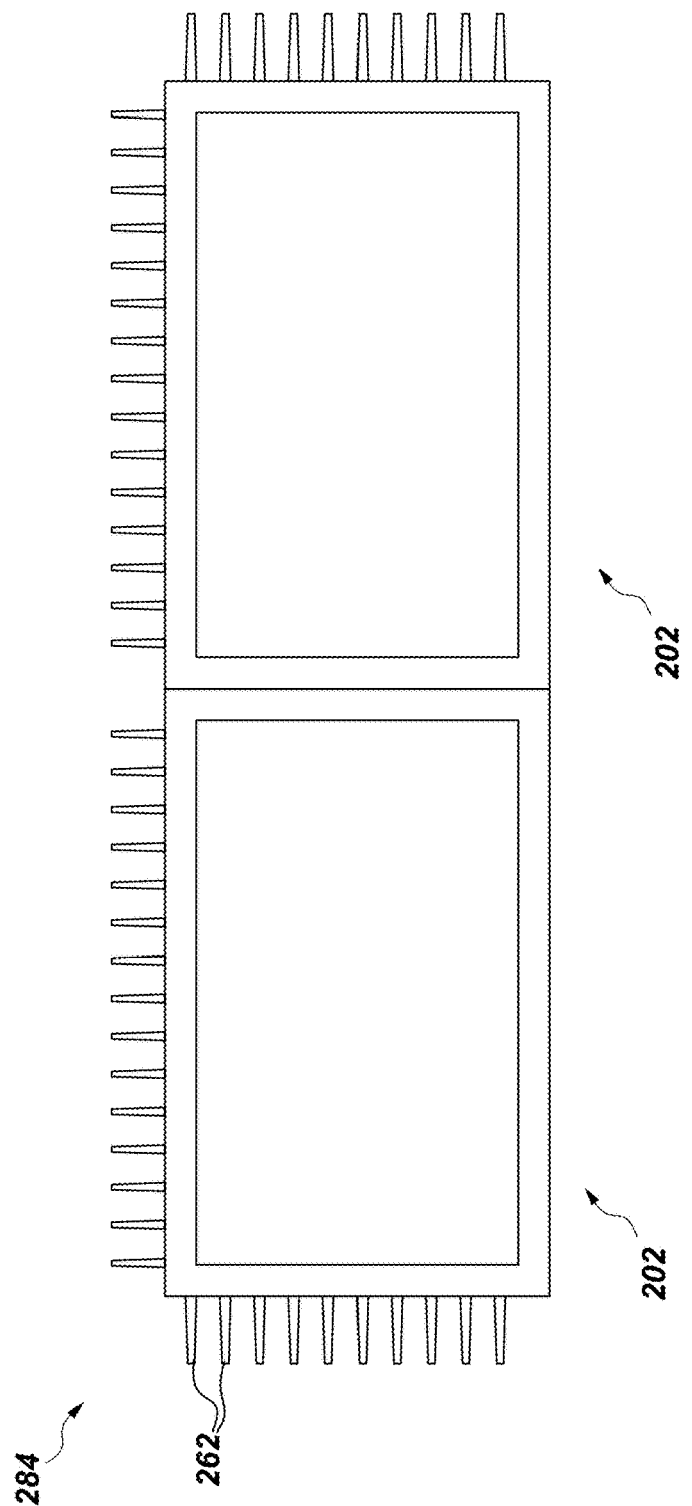
FIG. 12 shows a thermal management system as a planar assembly including two or more of the thermal skeletons planarly assembled to form the chassis body.
Figure 13:
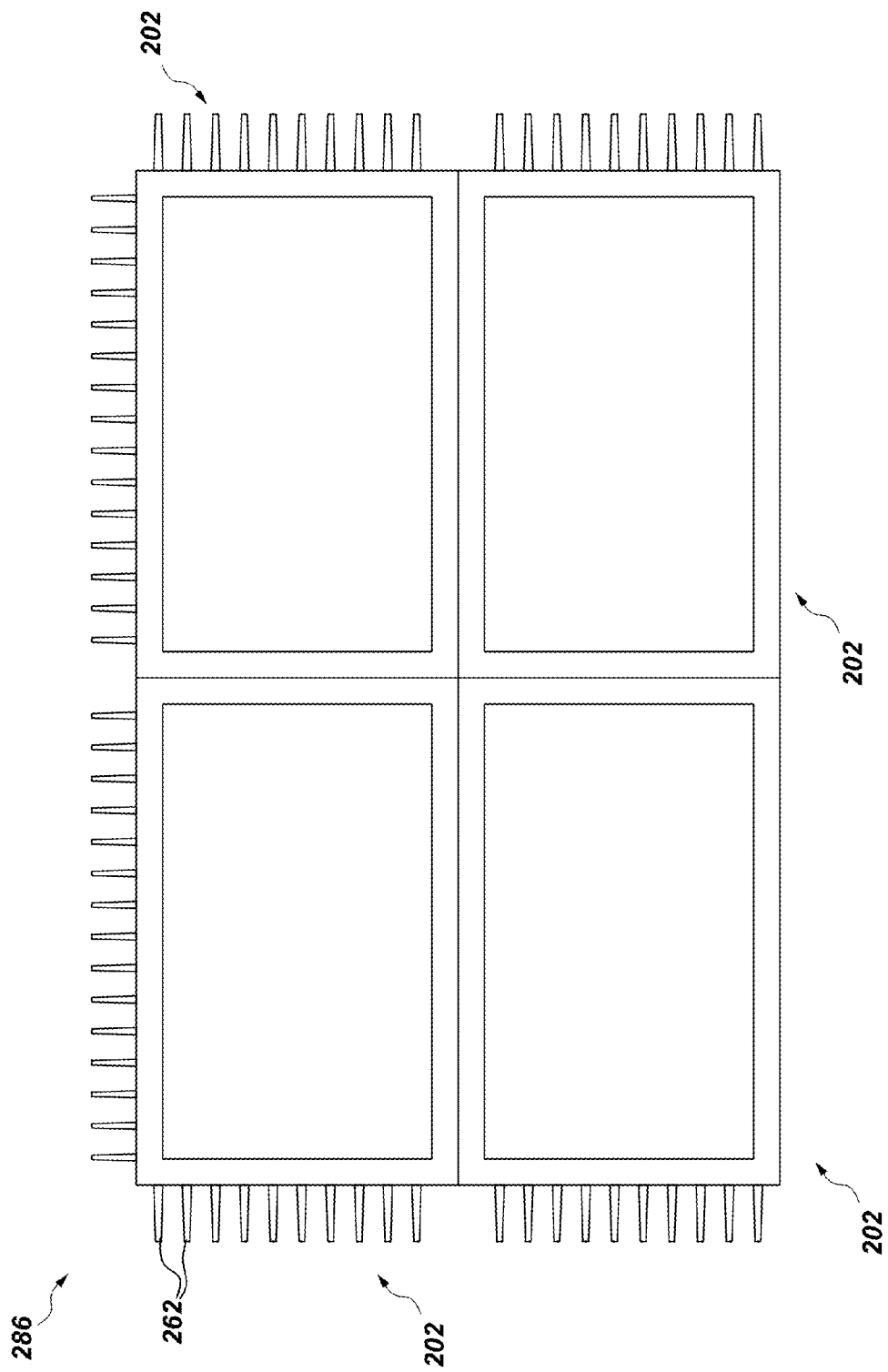
FIG. 13 shows a thermal management system as a combination of vertical and planar assembly including four or more of the thermal skeletons planarly and vertically assembled to form the chassis body.

FIG. 12 shows a thermal management system 284 as a planar assembly such as circular, square or rectangular, including two or more partitioned chassis frames 202 planarly assembled to form the chassis of the system 284. Referring again to FIG. 12, the assembled thermal management system 284 has a chassis frame that includes a number of partitioned modules/thermal skeletons 202 from a planar perspective. In one example, a typical chassis frame unit is replaced by several thermal skeletons 206 arranged in a planar manner coupling the thermal skeletons with respective chassis body 204 and assembled to provide thermal and structural support to the thermal management system 284. In this configuration, even if one of the thermal skeletons 206 is damaged, the other thermal skeletons keep supporting and cooling the electronics. Such a system structure supports redundancy and critical mission initiatives. FIG. 13 shows a thermal management system 286 as a combination of the features of the systems in FIGS. 11 and 12. Referring to FIG. 13, a number of chassis frames 202 are arranged such that some are vertically stacked and some are planarly assembled.

Figure 14:
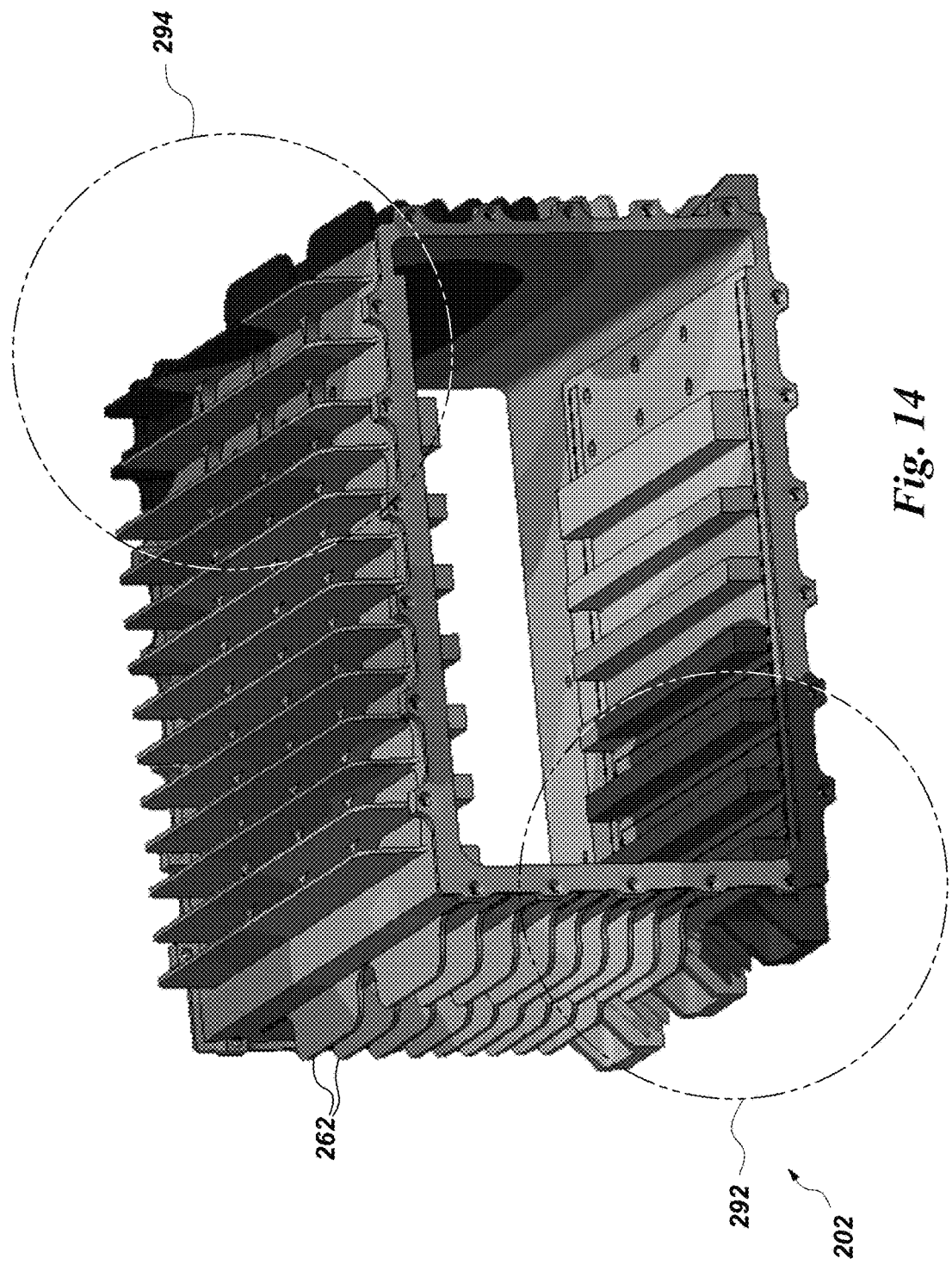
FIG. 14 shows improvement in thermal conduction.

FIG. 14 shows the thermal flow path in a chassis frame 202 of FIG. 3 without the assembly of circuit cards 208. Specifically, FIG. 14 is a cut away side perspective and depicts a chassis frame 202. As noted in FIG. 3, circuit cards 208 generate heat that is conducted to the thermal skeleton 206 and then to the chassis body 204. The chassis body 204 further spreads the heat to the chassis frame 202 and then to the fins 262 (FIG. 9). Thus, the heat is finally dissipated to the environment and fins 262 that are designed to be large enough to dissipate the expected heat from the circuit cards. FIG. 14 shows hotter region 292 and colder region 294 that is much reduced or eliminated compared to the system in FIG. 2. This is achieved by deploying heat conduction path through the thermal skeletons 206 and thereby reducing the thermal spreading resistance of the system. Typically, such thermal spreading resistance is caused by several thermal concentration events such as thermal gradient, thermal non-uniformity and hot-spot formation within the chassis body 204 and those are evidently reduced by the operation of the thermal skeleton 204.

Figure 15:
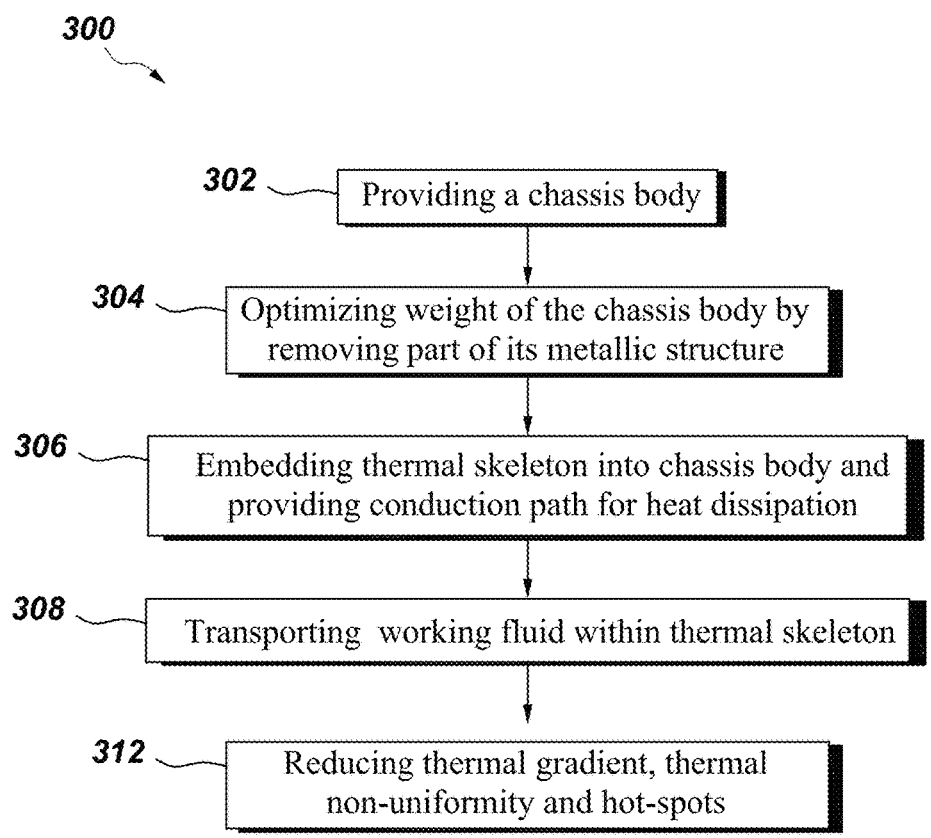
FIG. 15 shows a method of thermal management in accordance with one embodiment of this application.

FIG. 15 shows a method 300 of thermal management. The method includes providing a chassis body as in step 302 and optimizing the chassis body by removing part of its metallic structure as in step 304. The method also includes embedding a thermal skeleton into chassis body and providing conduction path for heat dissipation as in step 306. The method also includes transporting a working fluid within thermal skeleton as in step 308. The method further includes reducing thermal gradient, thermal non-uniformity and hotspots as in step 312.

In operation, according to one embodiment, the thermal management system includes a thermal skeleton having an inner wall with an internal wick structures disposed on the inner wall, internal working fluid, and additional internal support structures. The system in one example is made as a single unitary structure, wherein the case, wick structures, and internal support structures are integrally formed during formation by 3D printing or other Additive Manufacturing process. The working fluid is typically added to the internal structure until the wick is saturated, then the outer case is sealed. This filling process introduces the working fluid into the case. In certain examples, some of the fluid will be in the liquid state, while some may be in the vapor state. When one part of the thermal management system is thermally connected to a cold reservoir, and another part to a heat source such as circuit cards, heat is conducted from the heat source, through adjacent vessel envelope wall, and into the adjacent wick structure which is saturated with liquid. This addition of heat causes the liquid phase of the working fluid to boil into the vapor phase within the vessel. The process is similar to that of an operating heat pipe.

In one embodiment, the wick structure is engineered such that very fine features are present near the heat source, thus increasing the strength of the capillary force. However, the fine structures have a high fluid resistance. Therefore, the wick structure between the cold reservoir and heat source is engineered as a coarse structure with smooth features that minimize the fluid resistance. The fine and coarse structures are engineered to maximize the rate of fluid transport, and thus the optimal amount of heat can be transferred.

In another embodiment, the wick structure between the cold reservoir and heat source includes finer structures close to the vapor gap, and coarser structures close to the vessel wall. The finer structures prevent the liquid phase of the working fluid passing through the wick from interacting with the vapor phase of the working fluid passing through the vapor space in the opposite direction. The coarser structures near the vessel wall allow the liquid to pass through the wick with minimal pressure drop. In one example, the thermal conduction path from the circuit card to the cold reservoir is enhanced by transporting the working fluid (any mix of liquid and vapor) contained within the thermal skeleton by means of capillary action through any combination of the wick structure and the internal support structure to dissipate heat from the chassis frame.

The assembly in one example enhances the thermal capability and the entire structure is fabricated using additive manufacturing technology to allow for complex geometries that are conformal to the circuit cards. Although the figures indicate "pockets" for the hot circuit cards, in one exemplary embodiment the thermal skeleton case "conforms" to the hot circuit cards via "pockets", "planes", or "posts", as needed. According to one example the wick structure is non-uniform wick oriented in the thickness direction. In another example the wick structure is a non-uniform wick having a thickness and planar directions.

In a thermal management system for electronics in a chassis, the circuit cards have parasitic heat losses that thermally coupled to the device. These losses are removed in order to maintain a proper operating environment for the electronics. In one example the present system moves the heat from the circuit card such as to cold sink reservoirs, thus maintaining the circuit card at low temperature.

The present systems reduce the thermal resistance of this thermal conduction path while maintaining or lowering the weight of the system. Certain technical advantages of the present system include lower weight, lower thermal resistance, unlimited shapes and form factors, unitary single piece construction. Commercial advantages include custom designs, lower price, and more capability and greater thermal elements in the same volume.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A thermal management system, comprising:
   at least one chassis frame configured to minimize a thermal spreading resistance of the thermal management system, the at least one chassis frame comprising:
   at least one chassis body;
   a plurality of interior chassis grooves on opposing sides of the at least one chassis body, each set of the interior chassis grooves configured for seating a respective one a plurality of electronics, the electronics including heat generating components that vary in a size and a shape, wherein the at least one chassis body is configured to be conductively coupled to the heat generating components;
   at least one thermal skeleton embedded into the at least one chassis body and comprising an integrated single piece structure of interconnected heat pipe structures disposed on at least two sides of the at least one chassis body, the at least two sides includes at least one of the opposing sides of the at least one chassis body; and
   a working fluid contained within the at least one thermal skeleton and used to dissipate heat from the at least one chassis body.

2. The system according to claim 1, wherein the at least one thermal skeleton provides a thermal conduction path for the heat and wherein the integrated single piece structure of interconnected heat pipe structures comprises at least one of: a single hermetic 3-dimensional heat pipe structure or a 3-dimensional heat pipe structure constructed from adjoining ones of the interconnected heat pipe structures.

3. The system according to claim 2, wherein the at least one thermal skeleton comprises a porous wick structure on at least some of interior of the at least one thermal skeleton, wherein the porous wick structure is configured to transport the working fluid by capillary action from a heated portion conductively coupled to the heat generating components to at least one receptacle away from the heat generating components.

4. The system according to claim 1, further comprising a heat sink thermally coupled to the at least one chassis frame and configured to further dissipate the beat from the working fluid.

5. The system according to claim 1, wherein the at least one chassis frame houses the plurality of electronics comprising the heat generating components that vary in the size and the shape and further wherein the at least one chassis body is conductively coupled to the heat generating components.

6. The system according to claim 1, wherein the at least one chassis body is configured to optimize its weight by replacing at least part of its metallic structure by a lighter substitute material than the metallic structure.

7. The system according to claim 6, wherein the lighter substitute material comprises the at least one thermal skeleton.

8. The system according to claim 1, wherein the at least one thermal skeleton comprises one or more posts configured to transport the working fluid through the interconnected heat pipe structures to dissipate the heat from the at least one chassis body.

9. The system according to claim 1, wherein the at least one chassis body is formed by at least one of chassis body is formed by at least one of: 3D printing or additive manufacturing process.

10. The system according to claim 1, wherein the thermal spreading resistance is caused by at least one of: a thermal gradient, a thermal non-uniformity, or a hot-spot formation within the at least one chassis body.

11. The system according to claim 1, wherein the thermal management system comprises at least one of:
   a vertical assembly comprising two or more of the at least one chassis body vertically assembled, to form the at least one chassis frame, or
   a planar assembly comprising two or more of the at least one chassis body planarly assembled, to form the at least one chassis frame.

12. A thermal management system, comprising:
   at least one chassis frame configured to minimize a thermal spreading resistance of the thermal management system, the at least one chassis frame comprising:
   at least one chassis body;
   a plurality of interior chassis grooves on opposing sides of the at least one chassis body, each set of the interior chassis grooves configured for seating a respective one a plurality of electronics, the electronics including heat generating components that vary in a size and a shape, wherein the at least one chassis body is configured to be conductively coupled to the heat generating components;
   wherein the at least one chassis body configured to optimize its weight by replacing at least part of its metallic structure by a lighter substitute material than the metallic structure; the lighter substitute material comprises at least one thermal skeleton embedded into the at least one chassis body and configured to provide a thermal conduction path for heat dissipating from the at least one chassis body, and the at least one thermal skeleton comprises an integrated single piece structure of interconnected heat pipe structures disposed on at least two sides of the at least one chassis body, the at least two sides includes at least one of the opposing sides of the at least one chassis body; and
   a working fluid contained within the at least one thermal skeleton and used to further dissipate the heat from the at least one chassis body; and
   a heat sink thermally coupled to the system at least one chassis frame and configured to further dissipate the heat from the working fluid.

13. The system according to claim 12, wherein the integrated single piece structure of interconnected heat pipe structures comprises at least one of: a single hermetic 3-dimensional heat pipe structure or a 3-dimensional heat pipe structure constructed from adjoining ones of the interconnected heat pipe structures.

14. The system according to claim 13, wherein the at least one thermal skeleton comprises a porous wick structure on at least some of interior of the at least one thermal skeleton, wherein the porous wick structure is configured to transport the working fluid by capillary action from a heated portion conductively coupled to the heat generating components to at least one receptacle in contact or close proximity to the heat sink.

15. The system according to claim 12, wherein the at least one chassis frame houses the plurality of electronics comprising the heat generating components that vary in the size and the shape and further wherein the at least one chassis body is conductively coupled to the heat generating components.

16. The system according to claim 12, wherein the at least one chassis body is formed by at least one of: 3D printing or additive manufacturing process.

17. The system according to claim 12, wherein the thermal spreading resistance is caused by at least one of: a thermal gradient, a thermal non-uniformity, or a hot-spot formation within the at least one chassis body.

18. A method comprising:
   minimizing a thermal spreading resistance in a chassis frame comprising:
   providing a chassis body;
   providing a plurality of interior chassis grooves on opposing sides of the chassis body, each set of the interior chassis grooves configured for seating a respective one a plurality of electronics, the electronics including heat generating components that vary in a size and a shape, wherein the chassis body is configured to be conductively coupled to the heat generating components;
   optimizing a weight of the chassis body by removing at least part of its metallic structure;
   embedding at least one thermal skeleton into the chassis body and thereby providing a conduction path for dissipation of heat from the chassis body, wherein the at least one thermal skeleton comprises an integrated single piece structure of interconnected heat pipe structures disposed on at least two sides of the at least one chassis body, the at least two sides includes at least one of the opposing sides of the chassis body;
   transporting a working fluid within the at least one thermal skeleton for further dissipation of the heat from the chassis body; and
   reducing at least one of: a thermal gradient, a thermal non-uniformity, or a plurality of hot-spots within the chassis body.

19. The method according to claim 18, wherein providing the conduction path comprises constructing the at least one thermal skeleton with at least one of: a single hermetic 3-dimensional heat pipe structure or a 3-dimensional heat pipe structure constructed from adjoining ones of the interconnected heat pipe structures.

20. The method according to claim 18, wherein the transporting the working fluid within the at least one thermal skeleton comprises transporting the working fluid by capillary action of a porous wick structure deployed on at least some of an interior of the at least one thermal skeleton.

21. The method according to claim 18, further comprising housing within the chassis frame, the plurality of heat generating components that vary in the size and the shape, wherein the chassis body is conductively coupled to the heat generating components.

* * * * *